(12) United States Patent
Kawase (10) Patent No.: US 6,897,649 B2
(45) Date of Patent: May 24, 2005

(54) MAGNETIC FIELD DETECTION CIRCUIT USING MAGNETIC IMPEDANCE DEVICE

(75) Inventor: Masahiro Kawase, Saitama-ken (JP)

(73) Assignee: Canon Denshi Kabushiki Kaisha, Saitama-ken (JP)

( * ) Notice: Subject to any disclaimer, the term of this patent is extended or adjusted under 35 U.S.C. 154(b) by 0 days.

(21) Appl. No.: 10/465,279

(22) Filed: Jun. 20, 2003

(65) Prior Publication Data

US 2004/0008026 A1 Jan. 15, 2004

(30) Foreign Application Priority Data

Jul. 12, 2002 (JP) ........................................ 2002-203754

(51) Int. Cl.[7] ............................................... G01R 33/05
(52) U.S. Cl. ........................ 324/249; 324/260; 324/244
(58) Field of Search ................................. 324/249, 244, 324/260, 207.13, 207.26; 360/110; 33/355 R, 363 R, 361; 331/65, 113 R, 111

(56) References Cited

U.S. PATENT DOCUMENTS 6,229,307 B1 * 5/2001 Umehara et al. ........... 324/249
6,456,068 B1    9/2002 Kawase ...................... 324/249
2002/0047701 A1    4/2002 Kawase .................. 324/117 R

* cited by examiner

Primary Examiner—N. Le
Assistant Examiner—Reena Aurora
(74) Attorney, Agent, or Firm—Fitzpatrick, Cella, Harper & Scinto

(57) ABSTRACT

A magnetic field detection circuit comprises a magnetic impedance device, a detection coil wound around or arranged close to the impedance device, an electric current application circuit for applying a pulse-shaped high frequency electric current substantially equally swinging to the positive side and the negative side to the magnetic impedance device, and a detection circuit for detecting a voltage generated in the detection coil in response to rises and falls of the applied pulse-shaped electric current and outputting a signal corresponding to the intensity of the external magnetic field on the basis of the outcome of the detection. The magnetic field detection circuit can provide nil-point setting on a stable basis by means of a simple circuit arrangement at low cost.

5 Claims, 6 Drawing Sheets

MAGNETIC FIELD DETECTION CIRCUIT USING MAGNETIC IMPEDANCE DEVICE

BACKGROUND OF THE INVENTION

1. Field of the Invention

This invention relates to a magnetic field detection circuit for detecting the intensity of the external magnetic field by using a magnetic impedance device whose impedance changes as a function of the external magnetic field in a state where a high frequency electric current is applied. More particularly, the present invention relates to a magnetic field detection circuit for highly sensitively and accurately detecting a very weak magnetic field generated by the terrestrial magnetism or a very weak electric current.

2. Related Background Art

In recent years, bearing sensors adapted to detect the terrestrial magnetism and electric current sensors capable of detecting a very weak electric current have come to be required to highly sensitively and accurately detect a very weak magnetic field so as to broaden the scope of application. Magnetic impedance devices (to be referred to as MI devices hereinafter) have been attracting attention as magnetic field detecting devices of this type. With a known magnetic field detecting method using MI devices, the magnetic field is detected by directly applying a high frequency electric current to a magnetic object and detecting the voltage signal generated by the detection coil wound around or arranged in the vicinity of the magnetic object.

The magnetic signal obtained by this detection method is odd-functional relative to an external magnetic field and has an advantage of providing a sufficient level of sensitivity at and near a nil-magnetic field without applying a bias magnetic field.

Figure 10:
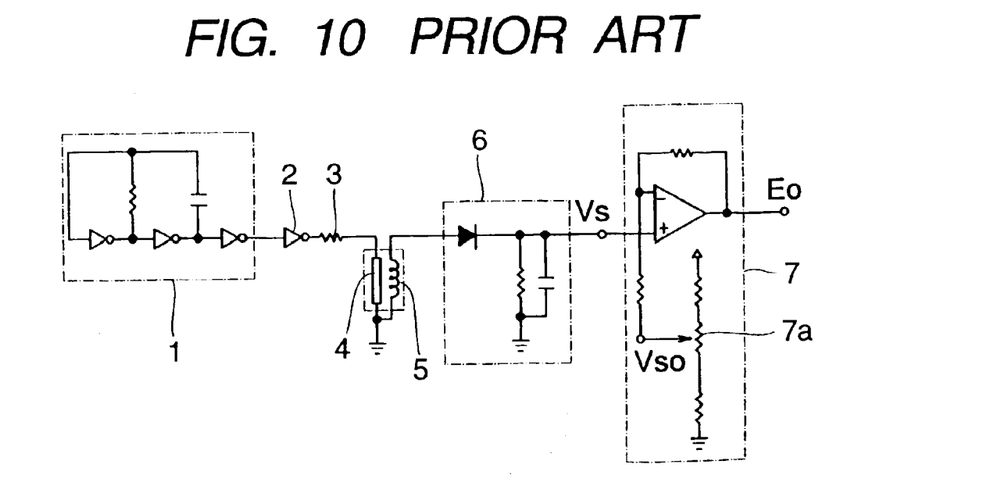
FIG. 10 is a schematic circuit diagram of a known magnetic field detection circuit.

FIG. 10 of the accompanying drawings is a basic circuit diagram of a circuit that can be used for this magnetic field detection method. Referring to FIG. 10, a pulse oscillation is generated in an MHz band by means of an oscillation circuit 1 formed by C-MOS inverters and a CR circuit surrounded by broken lines and an electric current is made to flow to MI device 4 by way of C-MOS inverter 2 and current regulating resistor 3. Note that the high frequency current (pulse current) generated by this circuit is modulated only at the positive side.

Then, the change in the magnetic flux caused by the MI device 4 is taken out as a change in the voltage generated in detection coil 5 by winding the detection coil 5 around the MI device 4 to form a solenoid or making it turn flat and bringing it close to the MI device 4. One of the opposite ends of the detection coil 5 is grounded while the other end is connected to waveform detection circuit 6 formed by a diode and a CR circuit so that an amplitude-modulated magnetic field signal is taken out from the waveform detection circuit 6. Alternatively, the magnetic field signal may be detected by synchronous detection substantially in synchronism with rises and falls of oscillation of the oscillation circuit 1 by means of an analog switch.

Figure 11:
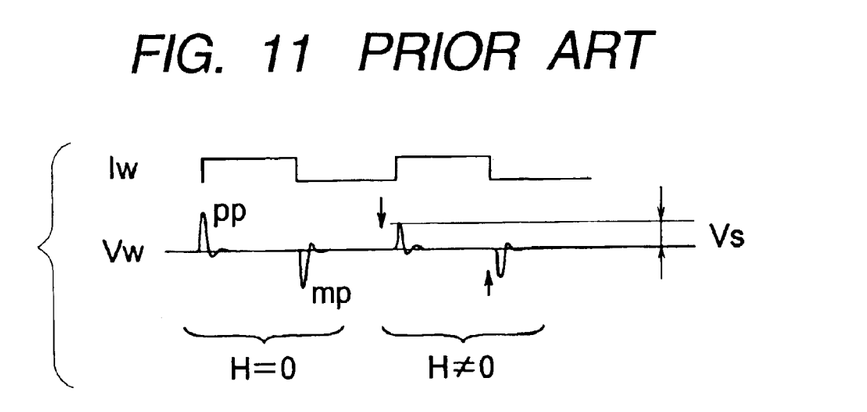
FIG. 11 is a graph illustrating the waveform of the response wave of the circuit of FIG. 10.
Figure 12:
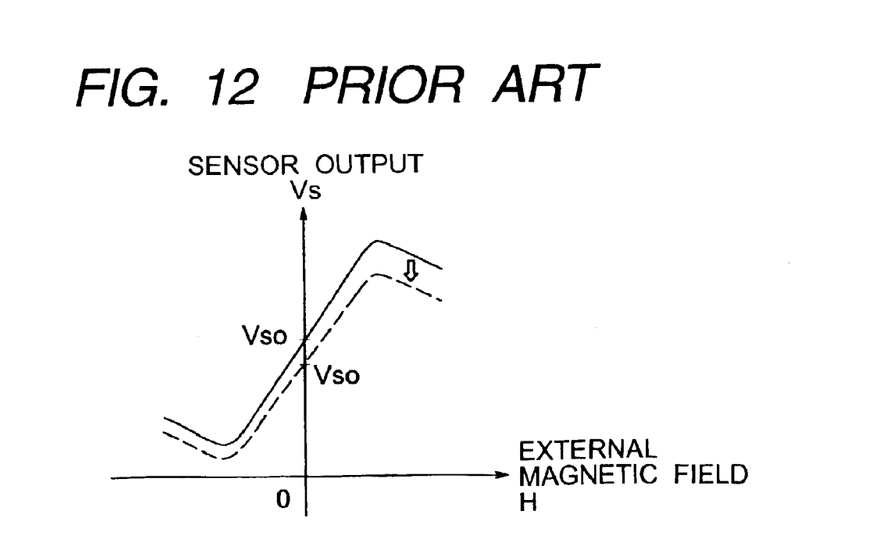
FIG. 12 is a graph illustrating the waveform of the output signal of the circuit of FIG. 10.

FIG. 11 shows such a magnetic field signal. As shown, the voltage waveform Vw of the detection coil 5 shows peaks corresponding to rises and falls in the waveform of the pulse current waveform Iw flowing to the MI device 4. Plus peaks pp and minus peaks mp are symmetrically arranged relative to the base line and move in opposite directions as indicated by arrows. The amplitude of the peaks varies as a function of that of the external magnetic field (H). The output Vs of the detection circuit is S-shaped as shown in FIG. 12 and shows a linear slope at and near a nil-magnetic field.

Meanwhile, from the viewpoint of application of bearing sensors and electric current sensors, it is essential that the sensor is so set that the signal output is nil when a nil-magnetic field is detected, or so-called nil-point setting is in place, in the operation of detecting the magnetic field of a DC current. If the nil-point setting is not in place, the detection accuracy of the bearing or electric current sensor will be adversely affected to a large extent.

More specifically, in the case of a bearing sensor, the terrestrial magnetism is measured by arranging magnetism detection devices such as MI devices respectively on the X and Y axes that rectangularly intersect each other on a horizontal plane and the azimuth is determined on the basis of the DC output voltages of the devices. A linear sensitivity of the sensor itself relative to an external magnetic field and the stability of the output absolute voltages Vx, Vy are essential to the accuracy of measuring the azimuth. Particularly, the stability of the output voltages has a vital importance.

The azimuth is determined by means of formula $\theta=\tan^{-1}\{(Vx-Vxo)/(Vy-Vyo)\}$. However, if the outputs Vxo, Vyo for a nil-magnetic field are not accurate, the calculation using the formula inevitably comes to involve errors. Particularly, the horizontal component of the terrestrial magnetism can be less than 100 mG (milligausses) at a place close to either of the magnetic poles or in a building so that the accuracy of calculation can be significantly affected if the outputs for a nil-magnetic field involve an error corresponding to 10 mG.

In the case of an electric current sensor, again, if the nil-point setting is not reliable, there can easily arise an error of several milliamperes (mA) in response to an output error of several milligausses (mG) when transforming the magnetic field from an electric current line into a voltage and evaluating the electric current that may be a DC as weak as tens of several milliamperes (mA).

Therefore, with the known arrangement of FIG. 10, the voltage Vso for a nil-magnetic field is detected in the characteristic graph of FIG. 12 and a reference voltage that matches the voltage Vso is selected by means of an amplifier 7 having a variable resistor 7a inserted between the power supply voltage and the grounding terminal. Then, the nil-point voltage is regulated manually, seeing the output of the amplifier.

However, the sensitivity can change as the ambient temperature changes. Then, the characteristic curve can be shifted in a manner as indicated by a broken line in FIG. 12. Under such circumstances, it is difficult to manually regulate the nil-point voltage. While it is theoretically possible to incorporate a circuit for automatically regulating the nil-point voltage, the overall circuit configuration will become highly complex and the cost will become prohibitive.

SUMMARY OF THE INVENTION

In view of the above identified problems, it is therefore an object of the present invention to provide a low cost magnetic field detection circuit that has a simple configuration and allows nil-point setting on a stable basis.

According to the invention, the above object is achieved by providing a magnetic field detection circuit comprising a magnetic impedance device formed by using a magnetic object showing an impedance variable relative to an external magnetic field with a high frequency electric current being applied thereto, a detection coil wound around or arranged close to the impedance device, an electric current application circuit for applying a pulse-shaped high frequency electric current substantially equally swinging to the positive side and the negative side to the magnetic impedance device, and a detection circuit for detecting a voltage generated in the detection coil in response to rises and falls of the applied pulse-shaped electric current and outputting a signal corresponding to the intensity of the external magnetic field on the basis of the outcome of the detection.

DESCRIPTION OF THE PREFERRED EMBODIMENTS

Now, the present invention will be described in greater detail by referring to FIGS. 1 through 9 of the accompanying drawings that illustrate preferred embodiments of the invention.

Figure 1:
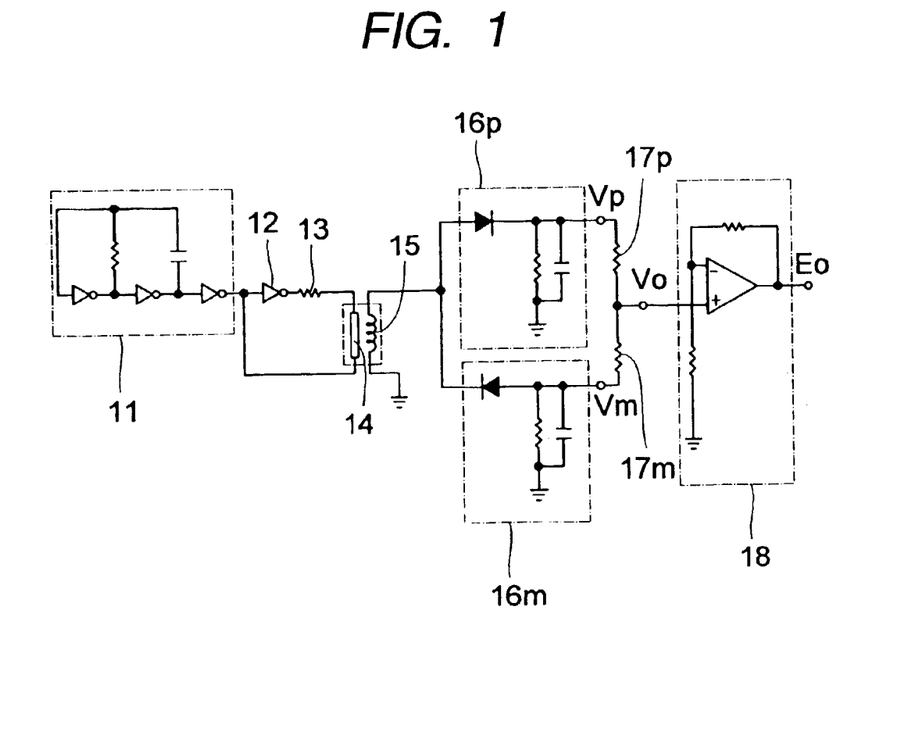
FIG. 1 is a schematic circuit diagram of an embodiment of magnetic field detection circuit according to the invention.

FIG. 1 is a schematic circuit diagram of an embodiment of magnetic field detection circuit according to the invention and comprising a magnetic impedance device. An oscillation circuit 11 surrounded by broken lines in FIG. 1 is formed by using C-MOS inverters and a CR circuit as in the case of the conventional one illustrated in FIG. 10. The output side of the oscillation circuit 11 is connected to one of the terminals of MI device 14 by way of a C-MOS inverter 12 and a current regulating resistor 13, while the other terminal of the MI device 14 is connected to the input side of the inverter 12. With the above described connection arrangement, an electric current adapted to swing symmetrically to the positive side and the negative side is applied to the MI device 14.

It is desirable that the electric current value of the positive side and that of the negative side are made to be substantially equal to each other particularly in terms of overshooting at rises and falls. Therefore, it is preferable that the difference of the electric current values of the positive and negative sides is not greater than 10% in relativity even though the difficulty in the operation in the high frequency range is taken into consideration. Alternatively, the circuit may be so arranged that a capacitance device is inserted between the inverter 12 and the MI device 14 and one of the terminals of the MI device 14 is grounded.

However, the circuit arrangement of FIG. 1 is preferable because, in view of that a relatively large electric current has to be supplied to the MI device 14 and the electric current needs to swing symmetrically to the positive side and the negative side, a large change can be produced in the electric current and symmetry can be realized with ease by applying back the same voltage to the inverter 12 rather than releasing the voltage to the ground. It is also desirable that the output of the inverter 12 shows an equal delay time for rises and falls of the electric current, as in the case of the output of the oscillation circuit 11, and the inverter 12 has a large output current capacity.

A coil is wound around the MI device 14 or a flatly turned helical coil is arranged near the MI device 14 to operate as detection coil 15. One of the terminals of the detection coil 15 is grounded while the other terminal is connected to waveform detection circuits 16p, 16m, each comprising a diode and a CR circuit. The diodes of the waveform detection circuits 16p, 16m are connected at opposite polarities and the waveform detection circuit 16p is adapted to hold the positive peak value of the voltage generated at the detection coil 15 and output voltage value Vp while the waveform detection circuit 16m is adapted to hold the negative peak value of the voltage generated at the detection coil 15 and output voltage value Vm. From the output values, the basic detection output Vo=(Vp+Vm)/2 is determined by way of resistors 17p, 17m that show a 1 to 1 resistance ratio.

Figure 2:
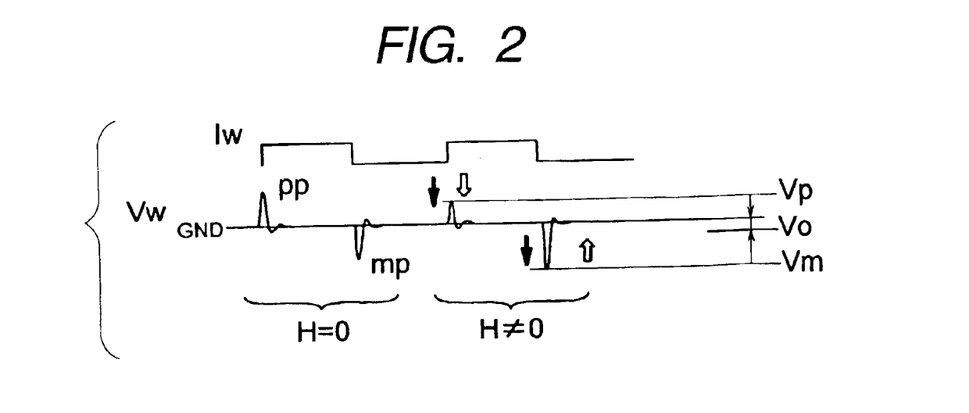
FIG. 2 is a graph illustrating the waveform of the response wave of the circuit of FIG. 1.

FIG. 2 is a graph illustrating the waveform of the response wave of the circuit of FIG. 1. A high frequency electric current of several MHz having an intensity of several mA to tens of several mA and showing a pulse-shaped waveform Iw is applied to the MI device 14. An output voltage waveform Vw showing plus peaks pp and minus peaks mp that reflect rises and falls of the pulse-shaped electric current is obtained by the detection coil 15. The waveform of peaks pp, mp normally accompanies ringing and changes according to the impedance characteristic of the MI device 14 and detection coil 15. Note that FIG. 2 shows an ideal waveform for the convenience of explanation.

As a result of research efforts, the inventor of the present invention found that, when an electric current that is evenly modulated for plus and minus is applied to the MI device 14, the peak values of plus peaks pp and minus peaks mp vary according to the external magnetic field in a manner different from those of an electric current that is modulated only for plus or minus in a conventional circuit.

More specifically, while plus peaks pp and minus peaks mp move symmetrically in opposite directions relative to the base line in a conventional circuit, both plus peaks pp and minus peaks mp move in the same direction as indicated by black arrows in FIG. 2 in this embodiment.

In a state where no external magnetic field is applied to the MI device 14 (H=0), plus peaks pp and minus peaks mp are symmetric relative to the base line and hence (Vp+Vm)/2 is equal to nil so that a nil-point is obtained on a stable basis without any regulating operation. As an external magnetic field is applied (H≠0), both plus and minus peaks shift in the same direction and the value of (Vp+Vm)/2 changes.

Figure 3:
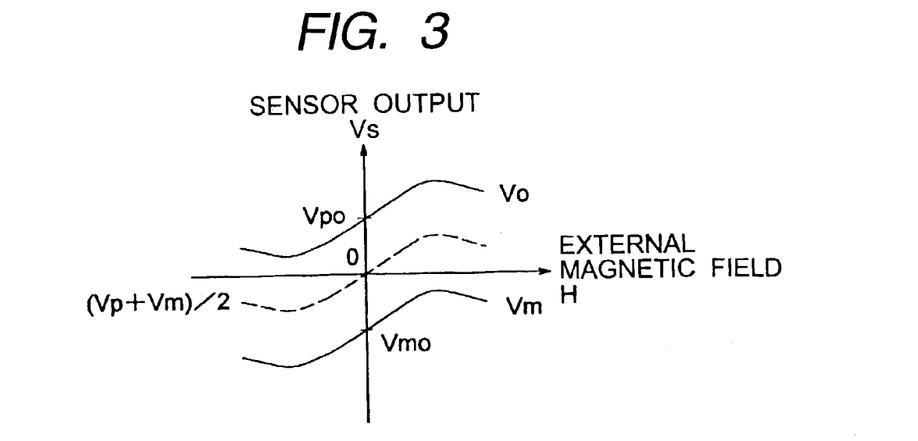
FIG. 3 is a graph illustrating the waveform of the output signal of the circuit of FIG. 1.

The positive side waveform detection voltage Vp and the negative side waveform detection voltage Vm are symmetric relative to the nil-magnetic field as shown in FIG. 3 and their curves change in the same manner relative to the external magnetic field. In other words, the curves are similar to each other and show the same tendency in terms of the external magnetic field. Thus, a nil-point can be defined clearly from Vo=(Vp+Vm)/2.

The final detection output is obtained after amplification by means of the amplifier 18 as shown in FIG. 1 in order to satisfy the required voltage level. If a high accuracy is rigorously required for the nil-point by raising the amplification ratio, the requirement can be met by finely regulating the partial voltages of the resistors 17p, 17m.

This embodiment provides another advantages of improving both the temperature characteristic and the S/N ratio. More specifically, while diodes show a temperature characteristic specific to each, plus peaks pp and minus peaks mp of the coil output waveform Vw due to the change in the temperature characteristic of the diodes of the waveform detection circuits 16p, 16m of this embodiment are made to change symmetrically relative to the base line (GND in FIG. 2) as indicated by while arrows as a result of inverting the polarities of the diodes for positive and negative detection so that consequently they are offset by the addition of (Vp+Vm)/2. Thus, consequently the stability of the nil-point is guaranteed.

As for the S/N ratio, while the power supply noise is added to the applied electric current in terms of amplitude modulation, both plus peaks pp and minus peaks mp are moved so as to become symmetrical relative to the base line as in the above described case of the temperature characteristic of diodes so that again they are offset by the addition to improve the S/N ratio. Thus, with a simple circuit configuration shown in FIG. 1, it is possible to easily provide nil-point setting on a stable basis without requiring any manual regulating operation.

Figure 4:
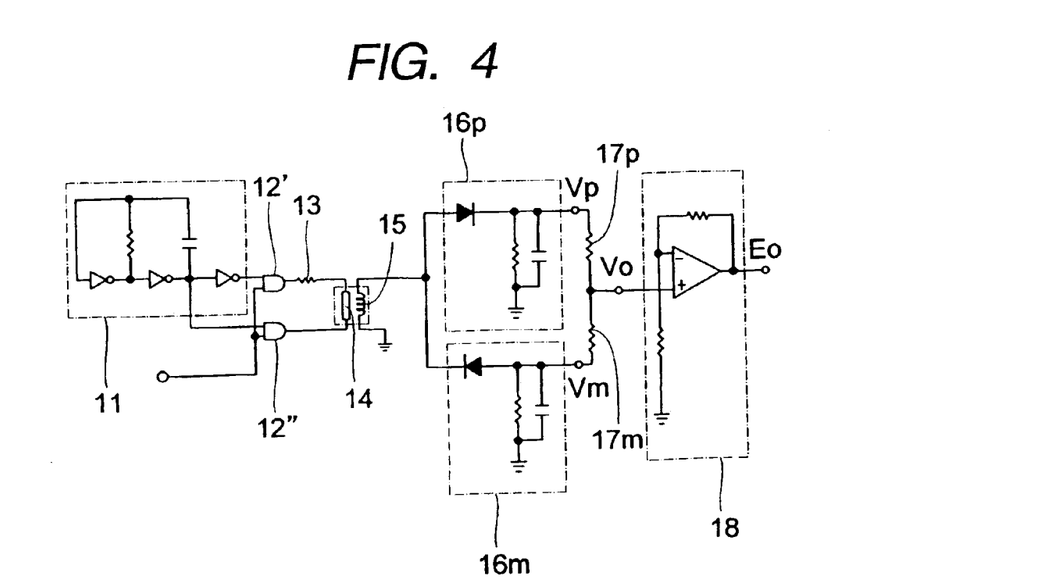
FIG. 4 is a schematic circuit diagram of a magnetic field detection circuit obtained by modifying the circuit of FIG. 1, using an inversion type logical circuit.

While the inverter 12 is used in the embodiment of FIG. 1, it may be needless to say that the inverter 12 can be replaced by inversion type logical devices 12', 12" such as NAND or NOR devices as shown in FIG. 4. It is also possible to adapt the circuit to intermittent drive operations.

Figure 5:
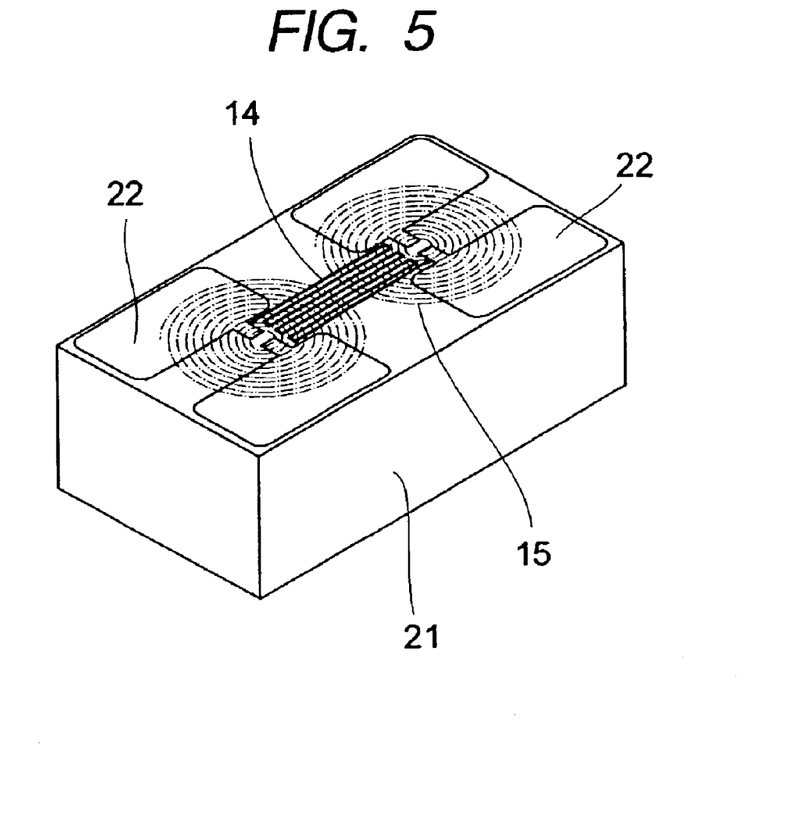
FIG. 5 is a schematic perspective view of an MI device.

As for the specific configuration of the embodiment, a flat and helical detection coil 15 (having 61 turns) made from copper thin film is formed by way of a film forming process on the MI device 14 that comprises a magnetic thin film formed on a non-magnetic substrate 21 such as glass substrate with an insulating film (not shown) interposed between the MI device 14 and the detection coil 15. Both the opposite terminals of the MI device 14 and those of the detection coil 15 are connected to terminal electrodes 22. The direction of magnetic field detection agrees with the longitudinal direction of the oblong MI device 14.

With this arrangement, since the thin film type detection coil 15 is laid on the magnetic thin film MI device 14, the MI device 14 and the detection coil 15 are brought very close to each other to a distance of micrometers so that the change in the magnetic flux at the MI device 14 can be transformed very efficiently into an induced voltage at the detection coil 15 to allow a high sensitivity detection.

The oscillation circuit 11 in FIG. 1 is connected to the MI device 14 by way of the terminal electrodes 22. The oscillation circuit 11 is made to oscillate to produce a pulse at 4 MHz and a high frequency current that oscillates both positively and negatively to an amplitude of about 10 mA (total amplitude of 20 mA) is made to flow to the MI device 14.

Figure 6:
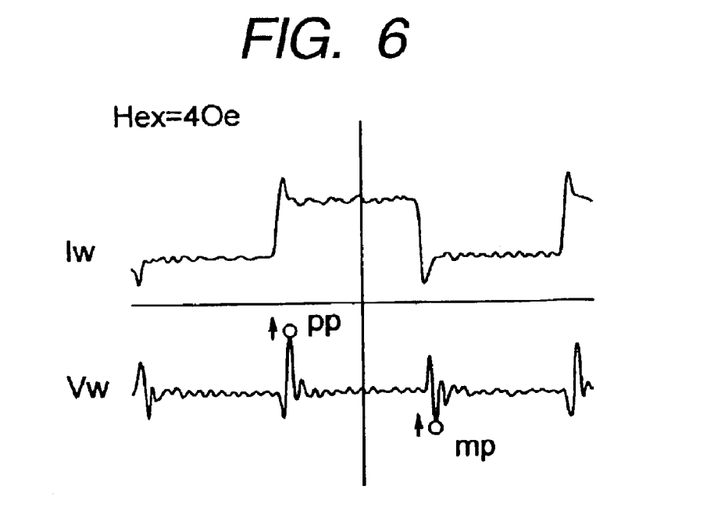
FIG. 6 is a graph illustrating the waveform of the electric current supplied to the MI device 14 in FIG. 5.

FIG. 6 shows the response waveform. In FIG. 6, the upper waveform corresponds to the waveform of the electric current Iw applied to the MI device 14 shown in FIG. 2, whereas the lower waveform corresponds to the output voltage waveform Vw of the detection coil 15 also shown in FIG. 2.

Overshooting occurs to the voltage of the MI device 14. Thus, peaks of the voltage waveform of the detection coil 15 differ from their counterparts of FIG. 2 but plus peaks pp and minus peaks mp indicated by circles are shifted in the direction indicated by arrows in a state where an external magnetic field is applied thereto. Note that the data of FIG. 6 are obtained when an external magnetic field is applied by 4 oersteds.

Figure 7:
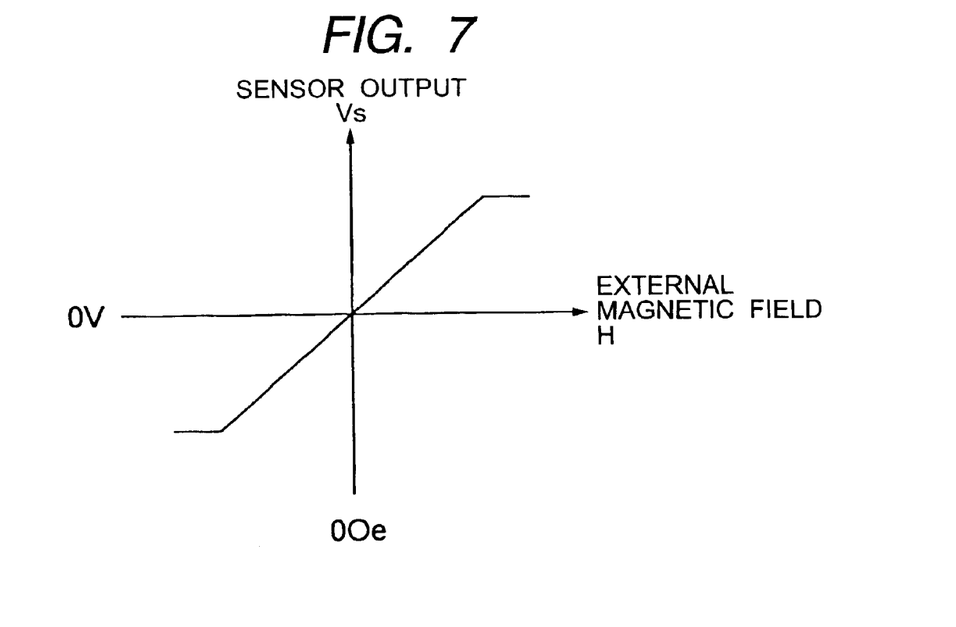
FIG. 7 is a graph illustrating the waveform of an output signal of the detection coil 15 in FIG. 5.

FIG. 7 is a graph illustrating the waveform of an output signal of the detection coil 15, illustrating its external magnetic field detection characteristic obtained when plus peaks pp and minus peaks mp are taken out by the waveform detection circuits 16p, 16m and amplified by 50 times by means of the amplifier 18. A nil-voltage is indicated in a nil-state of external magnetic field H and a good linearity is obtained to provide a sensitivity of 830 mV/Oe. The points of inflexion at the opposite ends of the central linear part of the S-shaped graph are produced by the saturation characteristic of the amplifier 18. The waveform detection circuits 16p, 16m provide linear sensitivities up to ±5 Oe.

Figure 8:
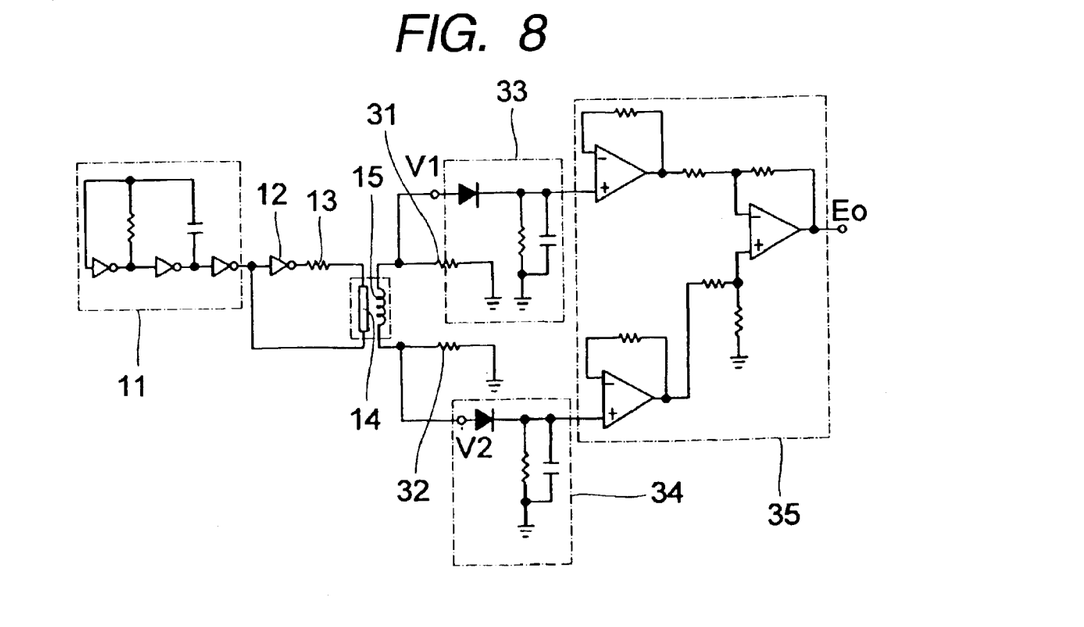
FIG. 8 is a schematic circuit diagram of another embodiment of magnetic field detection circuit according to the invention.

FIG. 8 is a schematic circuit diagram of another embodiment of magnetic field detection circuit according to the invention and also adapted to take out a detection output from a detection coil 15. The method of energizing the MI device 14 and the positional arrangement of the detection coil 15 of this embodiment are same as those of the first embodiment. The components that are same as or similar to those of the first embodiment are denoted respectively by the same reference symbols and will not be described any further.

The opposite ends of the detection coil 15 are grounded by way of respective resistors 31, 32. Waveform detection circuits 33, 34 are made to hold plus peaks pp and minus peaks mp respectively by means of the respective voltages at the opposite ends of the resistors 31, 32 and the difference of their outputs are amplified by differential amplifier 35 to produce an output Eo.

Figure 9:
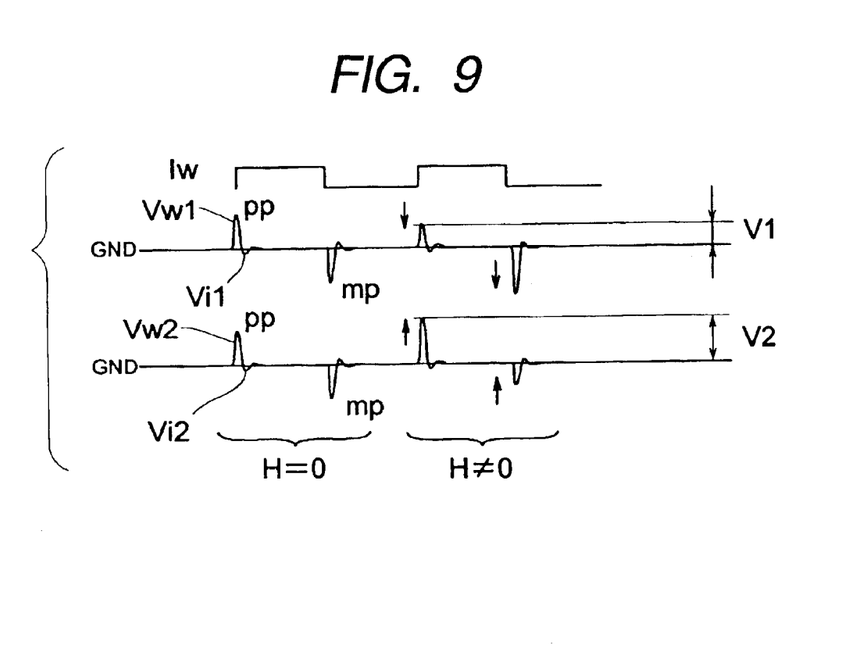
FIG. 9 is a graph illustrating the waveform of the response wave of the circuit of FIG. 8.

FIG. 9 is a graph illustrating the waveform of the response wave of the circuit of FIG. 8. The waveforms of the voltages at the opposite ends of the resistors 31, 32 that are produced in response to the pulse-shaped high frequency electric current Iw applied to the MI device 14 are indicated by Vw1 and Vw2. Plus peaks pp and minus peaks mp move in respect of the waveforms Vw1, Vw2 in opposite directions as indicated by arrows in FIG. 9 and peak voltages are output with the same height for a nil-magnetic field to prove that nil-point setting can be achieved on a stable basis also by means of the technique of the second embodiment.

As described above in detail, with a magnetic field detection circuit according to the invention, both plus peaks and minus peaks of the voltage generated at the detection coil are moved in the same direction in response to an external magnetic field by applying a pulse-shaped high frequency electric current that is made to equally swing to both the positive side and the negative side to an MI device. Therefore, a nil-point is obtained on a stable basis by detecting the opposite peak values and adding the partial voltages of voltage dividing resistors. Thus, it is possible to provide a magnetic field detection circuit that operates excellently in terms of temperature characteristic and S/N ratio at low cost.

A similar effect can be obtained by connecting resistors between the opposite ends of the detection coil and the grounding terminal respectively, detecting the voltages at the opposite ends of the resistors and amplifying the difference.

What is claimed is:

1. A magnetic field detection circuit comprising:
   a magnetic object;
   a detection coil wound around or arranged close to the magnetic object;
   an electric current application circuit for applying a pulse-shaped high frequency electric current to the magnetic object, wherein the pulse-shaped high frequency electric current swings substantially equally to the positive side and the negative side; and
   a detection circuit for detecting a voltage generated in the detection coil in response to rises and falls of the applied pulse-shaped electric current, wherein positive peaks and negative peaks of the detected voltage shift in the same direction in response to an external magnetic field, and for outputting a signal corresponding to the intensity of the external magnetic field on the basis of the detection.

2. The circuit according to claim 1, wherein said electric current application circuit generates an output showing an inverted relationship relative to an oscillation output of a logic IC by means of an inversion type logic IC and supplies the oscillation output to one of the terminals of said magnetic object and the output showing an inverted relationship to the other terminal.

3. The circuit according to claim 1, wherein said detection circuit has a waveform detection circuit for holding or detecting the plus peak voltage and the minus peak voltage generated at said detection coil and a voltage dividing circuit for dividing the plus peak voltage and the minus peak voltage that are held or detected and outputs the divided voltage values as signal corresponding to the intensity of said external magnetic field.

4. The circuit according to claim 3, wherein the resistances used for said voltage division show a 1 to 1 ratio.

5. The circuit according to claim 1, wherein said detection circuit has resistors arranged respectively between the opposite ends of said detection coil and the grounding terminal, a circuit for detecting the voltages at the opposite ends of said detection coil and an amplifier for amplifying the difference of the detected voltages.

* * * * *